US010249686B2

United States Patent
Gu et al.

(10) Patent No.: US 10,249,686 B2
(45) Date of Patent: Apr. 2, 2019

(54) ORGANIC LIGHT-EMITTING DEVICE AND METHOD OF MANUFACTURING THE SAME

(71) Applicant: Wuhan China Star Optoelectronics Technology Co., Ltd., Wuhan, Hubei (CN)

(72) Inventors: Yu Gu, Guangdong (CN); Hsianglun Hsu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 83 days.

(21) Appl. No.: 15/310,150

(22) PCT Filed: Sep. 14, 2016

(86) PCT No.: PCT/CN2016/098950
§ 371 (c)(1),
(2) Date: Nov. 10, 2016

(87) PCT Pub. No.: WO2018/035900
PCT Pub. Date: Mar. 1, 2018

(65) Prior Publication Data
US 2018/0182824 A1 Jun. 28, 2018

(30) Foreign Application Priority Data

Aug. 24, 2016 (CN) .......................... 2016 1 0718555

(51) Int. Cl.
*H01L 29/08* (2006.01)
*H01L 27/32* (2006.01)
(Continued)

(52) U.S. Cl.
CPC .......... *H01L 27/3213* (2013.01); *H01L 27/32* (2013.01); *H01L 51/001* (2013.01);
(Continued)

(58) Field of Classification Search
CPC . H01L 27/3213; H01L 51/001; H01L 51/504; H01L 51/56; H01L 27/322; H01L 27/3209
(Continued)

(56) References Cited

U.S. PATENT DOCUMENTS

2004/0113875 A1* 6/2004 Miller .................. G09G 3/3216
345/82
2005/0225232 A1* 10/2005 Boroson ............. H01L 27/3213
313/504
(Continued)

FOREIGN PATENT DOCUMENTS

CN 101079470 A 11/2007
CN 104347808 A 2/2015

*Primary Examiner* — Dzung Tran
(74) *Attorney, Agent, or Firm* — Andrew C. Cheng

(57) ABSTRACT

An organic light-emitting device proposes a primary pixel including one or more first subpixel, second subpixel, and third subpixel. The first subpixel is a white subpixel. The second subpixel includes the first light-emitting material for synthesizing the white light. The third subpixel includes the second light-emitting material. The organic light-emitting device further includes a third light-emitting material. The material for the second subpixel includes an original color zone and a synthesized color zone. The first light-emitting material for synthesizing the white light corresponding to the synthesized color zone. The transmission distance of the excitons produced by the second light-emitting material is smaller than the thickness of the function layer with the second light-emitting material. By using the organic light-emitting device, the brightness and color saturation of an image is well improved, power consumes less, and the lifespan of the organic light-emitting device is prolonged.

18 Claims, 4 Drawing Sheets

(51) Int. Cl.
 *H01L 51/00* (2006.01)
 *H01L 51/50* (2006.01)
 *H01L 51/56* (2006.01)

(52) U.S. Cl.
 CPC ........ *H01L 51/0011* (2013.01); *H01L 51/504* (2013.01); *H01L 51/56* (2013.01)

(58) Field of Classification Search
 USPC ........................................ 257/40, 59, 79, 98
 See application file for complete search history.

(56) References Cited

U.S. PATENT DOCUMENTS

| | | |
|---|---|---|
| 2006/0187155 A1 | 8/2006 | Chang et al. |
| 2006/0231842 A1* | 10/2006 | Hirakata ............... H01L 25/048 257/72 |
| 2007/0228938 A1* | 10/2007 | Hatwar ............... H01L 27/3213 313/504 |
| 2011/0037071 A1* | 2/2011 | Ozawa ................ H01L 27/3211 257/59 |
| 2014/0183471 A1 | 7/2014 | Heo |
| 2014/0183499 A1 | 7/2014 | Kim et al. |
| 2014/0247200 A1* | 9/2014 | Jinta .................... H01L 25/048 345/76 |
| 2015/0064818 A1 | 3/2015 | Li et al. |
| 2016/0260921 A1 | 9/2016 | Liu et al. |
| 2017/0125486 A1 | 5/2017 | Chen |

* cited by examiner

501 — Arrange a substrate layer, a first electrode layer, a light-emitting layer, and a second electrode in layers to form a display panel including a plurality of primary pixels arranged in a display zone. The display zone in the display includes a plurality of primary pixels. Each of the plurality of primary pixels includes one or more first subpixel, second subpixel, and third subpixel. The first subpixel is a white subpixel. The second subpixel includes a first light-emitting material for synthesizing the white light. The third subpixel includes a second light-emitting material. The organic light-emitting device further includes a third light-emitting material for synthesizing the white light. The material for the second subpixel includes an original color zone and a synthesized color zone. The first light-emitting material for synthesizing the white light corresponding to the synthesized color zone and one portion of the third light-emitting material are layered or mixed to form the white subpixel. The other portion of the third light-emitting material and the second light-emitting material are layered. The transmission distance of the excitons produced by the second light-emitting material is smaller than the thickness of the function layer with the second light-emitting material.

502 — Evaporate all of the function layers apart from the light-emitting layer for the subpixel.

Fig. 5

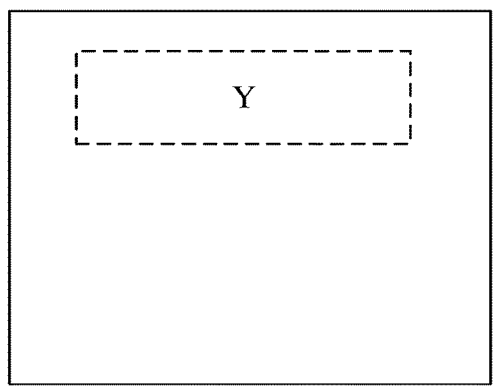

Fig. 6A

ORGANIC LIGHT-EMITTING DEVICE AND METHOD OF MANUFACTURING THE SAME

BACKGROUND

1. Field of the Disclosure

The present disclosure relates to the field of display technology, and more particularly, to an organic light-emitting device and a method of manufacturing the organic light-emitting device.

2. Description of the Related Art

An organic light-emitting diode (OLED) device features high efficiency, high brightness, wide view angles, low power consumption, self-illumination, low driver voltage, swift response speed, full colors, light materials, full of flexibility, easy processing, suitable to wildlife use, etc. Owing to these features, a display device with the OLED performs better and contains larger amount of information and can fulfill the requirements demanded by the era of information technology. Therefore, the OLED device has become one of the main display techniques.

Generally, three primary subpixels (i.e., red (R), green (G), and blue (B) primary colors) are arranged to obtain white background color in a conventional OLED device. Only when the RGB subpixels are lit at the same time does the white background color is obtained. However, such a design consumes a larger amount of electricity than a simple white light device does. The display device with the design also consumes larger power.

By arranging the four W subpixels with the white light in one pixel zone, the white light is obtained without lighting the RGB color subpixels at the same time. However, it is necessary to attach a corresponding red filter film, a corresponding blue filter film, and a corresponding green filter film to a cover to form the RGB colors even though the method of arranging the four W subpixels with the white light in one pixel zone is adopted. The light emitted by the RGB color subpixels needs to pass through three color filters with this method. Inevitably, the energy of the light is partially lost, and the display device with the design also consumes larger power.

Conventionally, the RGBW subpixels are arranged in one pixel zone independently so that no color filters are needed. However, during the process of manufacturing the RGBW subpixels, a light-emitting layer in each of the RGBW or more subpixels needs to be supplied with an independent mask plate. Also, it costs much to produce, transport, clean, and maintain the mask plates. In sum, it is disadvantage of the development of the OLED technique.

SUMMARY

An object of the present disclosure is to propose an organic light-emitting device and a method of manufacturing the organic light-emitting device to solve the problems that the power consumption of a conventional organic light-emitting device is high, and the production cost of a conventional organic light-emitting device is high as well.

According to the present disclosure, an organic light-emitting device comprises: a substrate layer, a first electrode layer, a light-emitting layer, and a second electrode arranged in layers; a display zone in the display comprising a plurality of primary pixels; each of the plurality of primary pixels comprising one or more first subpixel, second subpixel, and third subpixel; the first subpixel being a white subpixel; the second subpixel comprising a first light-emitting material for synthesizing the white light; the third subpixel comprising a second light-emitting material. The organic light-emitting device further comprises a third light-emitting material for synthesizing the white light; the material for the second subpixel comprising an original color zone and a synthesized color zone. The first light-emitting material for synthesizing the white light corresponding to the synthesized color zone and one portion of the third light-emitting material are layered or mixed to form the white subpixel. The other portion of the third light-emitting material and the second light-emitting material are layered. A transmission distance of an exciton produced by the second light-emitting material is smaller than a thickness of a function layer with the second light-emitting material. The third light-emitting material is formed in a zone corresponding to the white subpixel and the third subpixel. All function layers apart from the light-emitting layers of all of the subpixels are integrally formed.

Furthermore, the second subpixel is a blue subpixel, the third subpixel is a red subpixel, and the original color zone of the blue light-emitting layer and the synthesized color zone of the blue light-emitting layer are the same blue light-emitting layer. The second light-emitting material is a red light-emitting material, and the third light-emitting material is a yellow light-emitting material.

Furthermore, the entity of the light-emitting material can be made from a hole-type material or an electronic material.

Furthermore, the thickness of the function layer with the red light-emitting material ranges from ten to one hundred nanometers (nm) (10 nm~100 nm).

Furthermore, the organic light-emitting device further comprises a green subpixel.

According to the present disclosure, an organic light-emitting device comprises: a substrate layer, a first electrode layer, a light-emitting layer, and a second electrode arranged in layers; a display zone in the display comprising a plurality of primary pixels; each of the plurality of primary pixels comprising one or more first subpixel, second subpixel, and third subpixel; the first subpixel being a white subpixel; the second subpixel comprising a first light-emitting material for synthesizing the white light; the third subpixel comprising a second light-emitting material. The organic light-emitting device further comprises a third light-emitting material for synthesizing the white light. The material for the second subpixel comprises an original color zone and a synthesized color zone. The first light-emitting material for synthesizing the white light corresponding to the synthesized color zone and one portion of the third light-emitting material are layered or mixed to form the white subpixel. The other portion of the third light-emitting material and the second light-emitting material are layered. A transmission distance of an exciton produced by the second light-emitting material is smaller than a thickness of a function layer with the second light-emitting material.

Furthermore, all function layers apart from the light-emitting layers of all of the subpixels are integrally formed.

Furthermore, the third light-emitting material is formed in a zone corresponding to the white subpixel and the third subpixel.

Furthermore, the second subpixel is a blue subpixel, the third subpixel is a red subpixel, and the original color zone of the blue light-emitting layer and the synthesized color zone of the blue light-emitting layer are the same blue light-emitting layer. The second light-emitting material is a red light-emitting material, and the third light-emitting material is a yellow light-emitting material.

Furthermore, the entity of the light-emitting material can be made from a hole-type material or an electronic material.

Furthermore, the thickness of the function layer with the red light-emitting material ranges from ten to one hundred nanometers (nm) (10 nm~100 nm).

Furthermore, the organic light-emitting device further comprises a green subpixel.

According to the present invention, a method of manufacturing an organic light-emitting device comprises: arranging a substrate layer, a first electrode layer, a light-emitting layer, and a second electrode in layers to form a display panel comprising a plurality of primary pixels arranged in a display zone. The display zone of the organic light-emitting device comprises a plurality of primary pixels. Each of the plurality of primary pixels comprises one or more first subpixel, second subpixel, and third subpixel; the first subpixel is a white subpixel. The second subpixel comprises a first light-emitting material for synthesizing the white light. The third subpixel comprises a second light-emitting material. The organic light-emitting device further comprises a third light-emitting material for synthesizing the white light; the material for the second subpixel comprising an original color zone and a synthesized color zone. The first light-emitting material for synthesizing the white light corresponding to the synthesized color zone and one portion of the third light-emitting material are layered or mixed to form the white subpixel. The other portion of the third light-emitting material and the second light-emitting material are layered. A transmission distance of an exciton produced by the second light-emitting material is smaller than a thickness of a function layer made of the second light-emitting material.

Furthermore, the formation of the light-emitting layer comprises steps of: adopting a mask with a first aperture for forming a light-emitting layer which the third light-emitting layer for synthesizing the white subpixel corresponds to; adopting a mask with a second aperture for forming a light-emitting layer which synthesizes the color for the white subpixel and the first light-emitting material corresponds to; forming a zone on the light-emitting layer for the white subpixel and the second subpixel; adopting a mask with a third aperture for forming a light-emitting layer which the second light-emitting material corresponds to; causing the first aperture and the second aperture to be larger than the third aperture.

Furthermore, the method further comprises a step of: evaporating all of the function layers apart from the light-emitting layer for the subpixel.

Furthermore, the third light-emitting material is formed in a zone corresponding to the white subpixel and the third subpixel.

Furthermore, the second subpixel is a blue subpixel, the third subpixel is a red subpixel, and the original color zone of the blue light-emitting layer and the synthesized color zone of the blue light-emitting layer are the same blue light-emitting layer. The second light-emitting material is a red light-emitting material, and the third light-emitting material is a yellow light-emitting material.

Compared with the related art, in the present disclosure each of the plurality of primary pixels includes one or more first subpixel, second subpixel, and third subpixel. The first subpixel is a white subpixel. The second subpixel includes the first light-emitting material for synthesizing the white light. The third subpixel includes the second light-emitting material. The organic light-emitting device further includes a third light-emitting material for synthesizing the white light. The material for the second subpixel includes an original color zone and a synthesized color zone. The first light-emitting material for synthesizing the white light corresponding to the synthesized color zone and one portion of the third light-emitting material are layered or mixed to form the white subpixel. The other portion of the third light-emitting material and the second light-emitting material are layered. The transmission distance of the excitons produced by the second light-emitting material is smaller than the thickness of the function layer with the second light-emitting material. With the method of using the red, green, blue, and white (RGBW) subpixels, the brightness and color saturation of an image is well improved, power consumes less, and the lifespan of the organic light-emitting device is prolonged. Besides, the white subpixel is formed after the one or more light-emitting material for synthesizing the white light and another light-emitting material for a required color are layered or mixed. The white subpixel and one or more of the second subpixels share with a mask with a larger aperture. Compared with the related art where four pixels are formed by a mask including four small apertures, the present disclosure skips a mask. Therefore, the production costs of the present disclosure are lower than the production costs of the related art. With the design of the thickness of the red light-emitting material layer, the pure red light can be obtained. On the premise that the display effect is not affected, no red filters are necessary. Therefore, the manufacturing process of the organic light-emitting device and the manufacturing method are both simplified. Further, the production costs are saved, and the structure of the organic light-emitting device is more compact.

BRIEF DESCRIPTION OF THE DRAWINGS

FIG. 5 is a flowchart diagram illustrating a method of producing an organic light-emitting device according to an embodiment of the present disclosure.

FIG. 6A illustrates a structure of a light-emitting layer of an organic light-emitting device using the method illustrated in FIG. 5 according to a first embodiment of the present disclosure.

DETAILED DESCRIPTION OF THE PREFERRED EMBODIMENTS

In the following description, specific details, such as specifically systematic structures, ports, and techniques, are proposed to facilitate explanation instead of limitations so that the readers can understand the specifications well. However, a person of skill in the art shall certainly understand that the specifications where other embodiments without such details can still be applied. In other conductions, the well-known devices, circuits, and methods are not detailed so that the main concept of the present disclosure can be fully elaborated.

Figure 1:
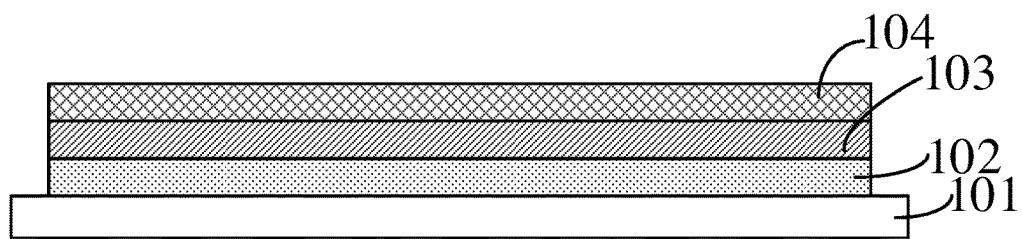
FIG. 1 is a schematic diagram of the structure of an organic light-emitting device according to an embodiment of the present disclosure.

Please refer to FIG. 1. FIG. 1 is a schematic diagram of the structure of an organic light-emitting device according to one preferred embodiment of the present disclosure. The organic light-emitting includes a substrate layer 101, a first electrode layer 102, a light-emitting layer 103, and a second electrode layer 104. The substrate layer 101, first electrode layer 102, light-emitting layer 103, and second electrode layer 104 are arranged in layers.

Especially, the substrate layer 101 is a transparent substrate. The substrate layer 101 may be a glass substrate or a flexible substrate. Provided that the substrate layer 101 is a flexible substrate, polyester, one kind of polyimide compound, or many kinds of polyimide compounds can be the material for the substrate layer 101.

The first electrode layer 102 is an anode layer of the organic light-emitting device. The second electrode layer 104 is a cathode layer of the organic light-emitting device.

The first electrode layer (i.e., the anode layer) 102 can be made from an inorganic material or an organic conductive compound. The inorganic material may be a metal or a metal compound. The metal is a metal with a higher work function, including gold, copper, silver, etc. The metal compound is specifically indium tin oxide (ITO), zinc oxide, oxide ZnSnO3, etc. The organic conductive compound may include polythiophene (PT), sodium dodecyl benzene sulfonate (SDBS), or polyaniline arbitrarily, or may include a combination of polythiophene (PT), sodium dodecyl benzene sulfonate (SDBS), and polyaniline.

The second electrode layer (i.e., the cathode layer) 104 can be made from a metal or a metal alloy. The metal is a metal with a lower work function, including lithium, magnesium, calcium, strontium, aluminum, indium, etc. The metal alloy may be a metal alloy with a lower work function or an alloy of the metal alloy with a lower work function and gold, silver, and copper. In another embodiment of the present disclosure, the second electrode layer 104 is a cathode layer of a metal and a metal fluoride which alternatively formed. For example, the cathode layer is formed after lithium fluoride and silver and lithium fluoride and aluminum are alternatively formed.

The light-emitting layer 103 is produced by a light-emitting material, fluorescence, and a phosphorescence light-emitting dopant. But the light-emitting material and the phosphorescence light-emitting dopant are not limited by the present disclosure.

The organic light-emitting device includes a display zone, and the display zone is formed by the substrate layer 101, the first electrode layer 102, the light-emitting layer 103, and the second electrode layer 104. The display zone includes a plurality of primary pixels. Each of the plurality of primary pixels includes one or more first subpixel, second subpixel, and third subpixel. The primary pixels and the subpixels all are basic units for emitting light. The display of an image is a predetermined result of the formation of each of the subpixels or primary pixels.

Figure 2:
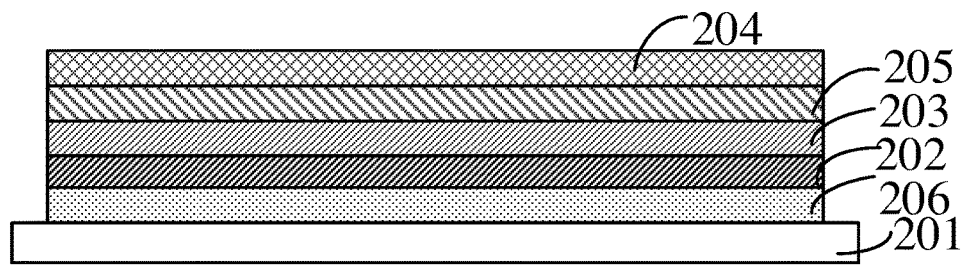
FIG. 2 is a schematic diagram of the structure of an organic light-emitting device according to another embodiment of the present disclosure.

As FIG. 2 shows, the organic light-emitting device further includes a hole transport layer (HTL) 202 and an electron transport layer (ETL) 205. In operation, a positive voltage is imposed on the first electrode layer (i.e., the anode layer) 206, and a negative voltage is imposed on the second electrode layer (i.e., the cathode layer) 204. Electrons are injected into the electron transport layer 205 from the second electrode layer 204 and moves to the light-emitting layer 203 through the electron transport layer 205 when the voltage drives the electrons. Holes are injected into the hole transport layer 202 from the first electrode layer 206 and moves to the light-emitting layer 203 through the hole transport layer 202. The electrons and the holes encounter and form excitons, which causes light-emitting particles to be excited. Afterwards, the excited light-emitting particles are radiated and then emit visible light.

The first subpixel is a white subpixel. The second subpixel includes the first light-emitting material for synthesizing the white light. The material for the second subpixel includes an original color zone and a synthesized color zone. The third subpixel includes a second light-emitting material. The organic light-emitting device further includes a third light-emitting material for synthesizing the white light. The first light-emitting material for synthesizing the white light corresponding to the synthesized color zone and one portion of the third light-emitting material are layered or mixed to form the white subpixel. The other portion of the third light-emitting material and the second light-emitting material are layered. The transmission distance of the excitons produced by the second light-emitting material is smaller than the thickness of the function layer with the second light-emitting material.

In one preferred embodiment, the second subpixel is a blue subpixel, and the third subpixel is a red subpixel. Also, the original color zone and the synthesized color zone of the blue light-emitting material are the same and both are the blue light-emitting layer. The material for the second light-emitting layer is a red light-emitting material, and the material for the third light-emitting layer is a yellow light-emitting material. The yellow light-emitting material is formed in the zone of the white subpixel and the third subpixel, i.e., the red subpixel. So the mask with the first aperture which is a larger aperture can be used to produce the yellow light-emitting layer. In this way, using of a mask with a small aperture is reduced in this embodiment, which is good for reducing the cost.

In addition, the organic light-emitting device further includes a green subpixel. The light-emitting layer of the green subpixel is manufactured with a mask with a smaller aperture.

The blue light-emitting material in the synthesized color zone and one portion of the yellow third light-emitting material are layered or mixed. The blue light-emitting material and the yellow light-emitting material are compensated in color and emit the white light. Therefore, the blue light-emitting material in the synthesized color zone and the yellow light-emitting material are layered or mixed to form a white subpixel.

Moreover, the original color zone of the blue light-emitting material which is not layered or mixed with the third light-emitting material emits the blue light.

The other portion of the third light-emitting material, i.e., the portion of the yellow light-emitting material not layered or mixed with the blue light-emitting material, is layered with the red light-emitting material. So the mask with the second aperture which is a larger aperture can be used to produce the yellow light-emitting layer. In this way, any mask with a small aperture will not be used is this embodiment, which is good for reducing the cost.

Figure 3:
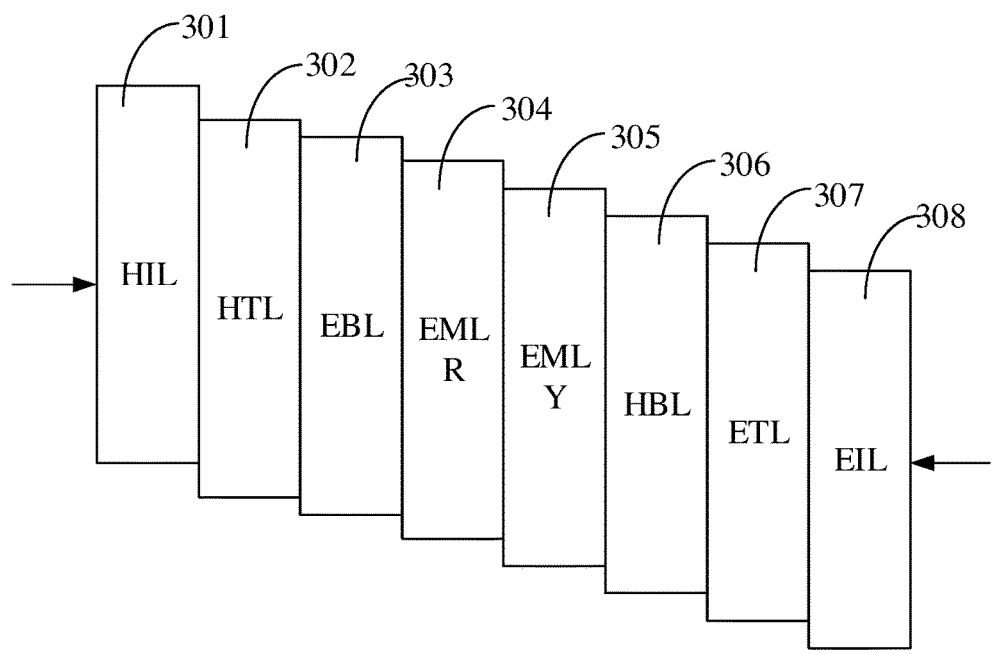
FIG. 3 shows a red subpixel of an organic light-emitting device according to an embodiment of the present disclosure.

The red-light material for the red subpixel and the yellow-light material for the red subpixel are partially layered within the zone where the blue subpixel is not overlapped or mixed. Because of this reason, the transmission distance of the excitons produced by the second light-emitting material is smaller than the thickness of the function layer made of the second light-emitting material in this embodiment. In this way, the red light emitted by the organic light-emitting device is nearly pure, and the light-emitting layer formed by the yellow light-emitting material does not cover the red-light zone. Specifically, the main body of the light-emitting layer for the red subpixel is made from an electron-type material, as FIG. 3 shows. FIG. 3 is a schematic diagram of the structure of a red subpixel according to one preferred embodiment of the present disclosure.

In another embodiment, the light-emitting layer of the red subpixel can be made from a hole-type material. No limitations are defined by the present disclosure.

As FIG. 3 shows, the red subpixel includes a hole injection layer (HIL) 301, a hole transport layer (HTL) 302, an electron blocking layer (EBL) 303, a red light-emitting material layer (EMLR) 304, a yellow light-emitting material layer (EMLY) 305, a hole blocking layer (HBL) 306, an electron transport layer (ETL) 307, and an electron injection layer (EIL) 308 from left to right. The excitons produced by the red light-emitting material exist on the interface between the electron blocking layer (EBL) 303 and the red light-emitting material layer (EMLR) 304. Since the transmission distance of the excitons produced by the red light-emitting material layer (EMLR) 304 is smaller than the thickness of the function layer with the second light-emitting material, the excitons are unable to penetrate the yellow light-emitting material layer. Accordingly, the red subpixel does not emit the yellow light. Definitely, the red subpixel emits the pure red light. The thickness of the red light-emitting material layer (EMLR) 304 is adjusted with practical demands. Normally, the thickness of the red light-emitting material layer (EMLR) 304 ranges from ten to one hundred nanometers (nm) (10 nm~100 nm).

With the design of the thickness of the red light-emitting material layer (EMLR) 304, the pure red light can be obtained. On the premise that the display effect is not affected, no red filters are necessary. Therefore, the manufacturing process of the organic light-emitting device and the manufacturing method are both simplified. Further, the production costs are saved, and the structure of the organic light-emitting device is more compact.

Furthermore, the mask with the third aperture which is a smaller aperture can be used to produce the light-emitting layer for the red subpixel. The third aperture is smaller than the first aperture and the second aperture. The aperture of the mask for producing the light-emitting layer for the green subpixel is also smaller than the first aperture and the second aperture. In this way, the present disclosure gets rid of relying on the mask with a smaller aperture.

Figure 4A:
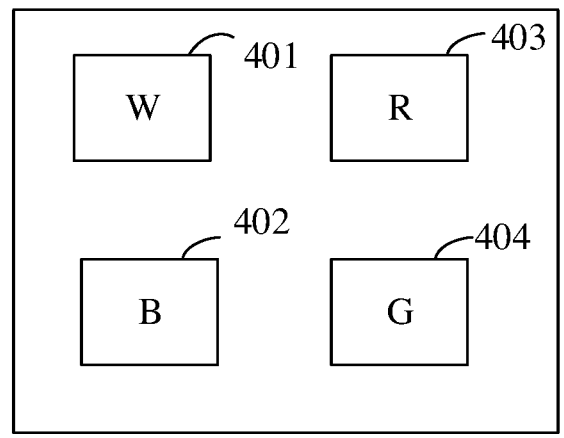
FIG. 4A is a schematic diagram of the structure of a primary pixel in a display zone in an organic light-emitting device according to a first embodiment of the present disclosure.
Figure 4B:
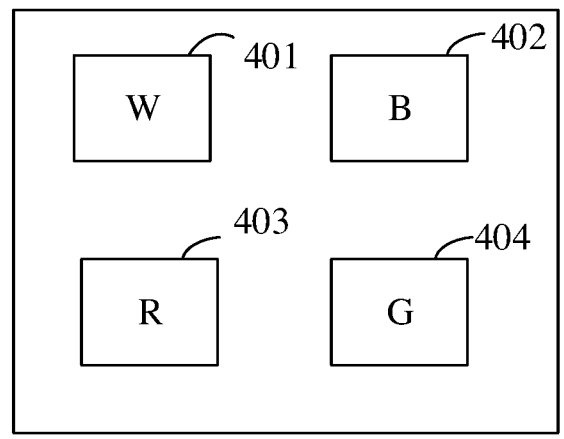
FIG. 4B is a schematic diagram of the structure of a primary pixel in a display zone in an organic light-emitting device according to a second embodiment of the present disclosure.

In each of the above-mentioned embodiments, the white subpixel is adjacent to the blue subpixel, and the white subpixel is adjacent to the red subpixel. FIG. 4A is a schematic diagram of the structure of a primary-pixel of a display zone of an organic light-emitting device according to one preferred embodiment of the present disclosure. A W subpixel 401 is a white subpixel, a B subpixel 402 is a blue subpixel, an R subpixel 403 is a red subpixel, and a G subpixel 404 is a green subpixel. A yellow light-emitting material is formed on a zone corresponding to a white subpixel and a red subpixel. No limitations are defined in this embodiment. In another embodiment, the primary pixel can be shown otherwise as long as the B subpixel is adjacent to the W subpixel, and the R subpixel is adjacent to the W subpixel, as FIG. 4B shows. No limitations are defined in this embodiment.

In any of the above-mentioned embodiments, the order of generation of each of the subpixel for the primary pixel can be different. In one of the embodiments, to start with, a light-emitting layer with the yellow light-emitting material is formed using the mask with the first aperture. Next, a light-emitting layer with the green light-emitting material is formed using the mask. Next, a light-emitting layer with the blue light-emitting material is formed using the mask with the second aperture. Finally, a light-emitting layer with the red light-emitting material is formed using the mask with the third aperture. The first aperture and the second aperture are larger than the third aperture. Besides, the aperture of the mask for forming the light-emitting layer with the green light-emitting material is smaller than the first aperture and the second aperture.

In another one of the embodiments, to start with, a light-emitting layer with the red light-emitting material is formed using the mask with the third aperture. Next, a light-emitting layer with the green light-emitting material is formed using the mask. Next, a light-emitting layer with the blue light-emitting material is formed using the mask with the second aperture. Finally, a light-emitting layer with the yellow light-emitting material is formed using the mask with the first aperture. The first aperture and the second aperture are larger than the third aperture. Besides, the light-emitting layer with the green light-emitting material formed using the mask with the aperture is smaller than the first aperture and the second aperture. No limitations are defined in this embodiment.

Compared with the related art where four pixels are formed by a mask including four small apertures, this embodiment skips a mask. Therefore, the production costs of the present disclosure are lower than the production costs of the related art. Compared with the conventional method of synthesizing the primary pixels with the RGB subpixels, in the present disclosure the white light is generated without lighting the RGB subpixels up at the same time, so the organic light-emitting device consumes less power. Compared with the conventional method of combining four white subpixels, a red filter, a blue filter, and a green filter, the present disclosure skips three filters or filter sheets. So the structure of the organic light-emitting device is simpler and thinner. Also, the energy of the light cannot lose easily, and further the organic light-emitting device cannot be damaged easily.

In addition, in the above-mentioned embodiment, the primary pixels and the subpixels include function layers, such as a hole injection layer (HTL), a hole transport layer (HTL), an electron stopper layer (ESL), a hole blocking layer (HBL), an electron transport layer (ETL), and an electron injection layer (EIL). All the function layers, but the light-emitting layer, are integrally formed.

Compared with the related art, in the present disclosure each of the plurality of primary pixels includes one or more first subpixel, second subpixel, and third subpixel. The first subpixel is a white subpixel. The second subpixel includes the first light-emitting material for synthesizing the white light. The third subpixel includes the second light-emitting material. The organic light-emitting device further includes a third light-emitting material for synthesizing the white light. The material for the second subpixel includes an original color zone and a synthesized color zone. The first light-emitting material for synthesizing the white light corresponding to the synthesized color zone and one portion of the third light-emitting material are layered or mixed to form the white subpixel. The other portion of the third light-emitting material and the second light-emitting material are layered. The transmission distance of the excitons produced by the second light-emitting material is smaller than the thickness of the function layer with the second light-emitting material. With the method of using the red, green, blue, and white (RGBW) subpixels, the brightness and color saturation of an image is well improved, power consumes less, and the lifespan of the organic light-emitting device is prolonged. Besides, the white subpixel is formed after the one or more light-emitting material for synthesizing the white light and another light-emitting material for a required color are layered or mixed. The white subpixel and one or more of the second subpixels share with a mask with a larger aperture. Compared with the related art where four pixels are formed by a mask including four small apertures, the present disclosure skips a mask. Therefore, the production costs of the present disclosure are lower than the production costs of the related art.

With the design of the thickness of the red light-emitting material layer (EMLR) 304, the pure red light can be obtained. On the premise that the display effect is not affected, no red filters are necessary. Therefore, the manufacturing process of the organic light-emitting device and the manufacturing method are both simplified. Further, the production costs are saved, and the structure of the organic light-emitting device is more compact.

Please refer to FIG. 5. FIG. 5 is a flowchart illustrating a method of producing an organic light-emitting device according to one preferred embodiment of the present disclosure. The method includes the following steps.

501: Arrange a substrate layer, a first electrode layer, a light-emitting layer, and a second electrode layer in layers to form a display panel including a plurality of primary pixels arranged in a display zone.

The display zone in the display includes a plurality of primary pixels. Each of the plurality of primary pixels includes one or more first subpixel, second subpixel, and third subpixel. The first subpixel is a white subpixel. The second subpixel includes a first light-emitting material for synthesizing the white light. The third subpixel includes a second light-emitting material.

The organic light-emitting device further includes a third light-emitting material for synthesizing the white light. The material for the second subpixel includes an original color zone and a synthesized color zone. The first light-emitting material for synthesizing the white light corresponding to the synthesized color zone and one portion of the third light-emitting material are layered or mixed to form the white subpixel.

The other portion of the third light-emitting material and the second light-emitting material are layered. The transmission distance of the excitons produced by the second light-emitting material is smaller than the thickness of the function layer with the second light-emitting material.

Especially, the substrate layer is a transparent substrate. The substrate layer may be a glass substrate or a flexible substrate. Provided that the substrate layer is a flexible substrate, polyester, one kind of polyimide compound, or many kinds of polyimide compounds can be the material for the substrate layer.

The first electrode layer is an anode layer of the organic light-emitting device. The second electrode layer is a cathode layer of the organic light-emitting device.

The first electrode layer (i.e., the anode layer) can be made from an inorganic material or an organic conductive compound. The inorganic material may be a metal or a metal compound. The metal is a metal with a higher work function, including gold, copper, silver, etc. The metal compound is specifically indium tin oxide (ITO), zinc oxide, oxide ZnSnO3, etc. The organic conductive compound may include polythiophene (PT), sodium dodecyl benzene sulfonate (SDBS), or polyaniline arbitrarily, or may include a combination of polythiophene (PT), sodium dodecyl benzene sulfonate (SDBS), and polyaniline.

The second electrode layer (i.e., the cathode layer) can be made from a metal or a metal alloy. The metal is a metal with a lower work function, including lithium, magnesium, calcium, strontium, aluminum, indium, etc. The metal alloy may be a metal alloy with a lower work function or an alloy of the metal alloy with a lower work function and gold, silver, and copper. In another embodiment of the present disclosure, the second electrode layer is a cathode layer of a metal and a metal fluoride which alternatively formed. For example, the cathode layer is formed after lithium fluoride and silver and lithium fluoride and aluminum are alternatively formed.

The light-emitting layer is produced by a light-emitting material, fluorescence, and a phosphorescence light-emitting dopant. But the light-emitting material and the phosphorescence light-emitting dopant are not limited by the present disclosure.

In one preferred embodiment, the second subpixel is a blue subpixel, and the third subpixel is a red subpixel. Also, the original color zone and the synthesized color zone of the blue light-emitting material are the same and both are the blue light-emitting layer. The material for the second light-emitting layer is a red light-emitting material, and the material for the third light-emitting layer is a yellow light-emitting material. The yellow light-emitting material is formed in the zone of the white subpixel and the third subpixel, i.e., the red subpixel.

In addition, the organic light-emitting device further includes a green subpixel. The light-emitting layer of the green subpixel is manufactured with a mask with a smaller aperture.

Figure 6B:
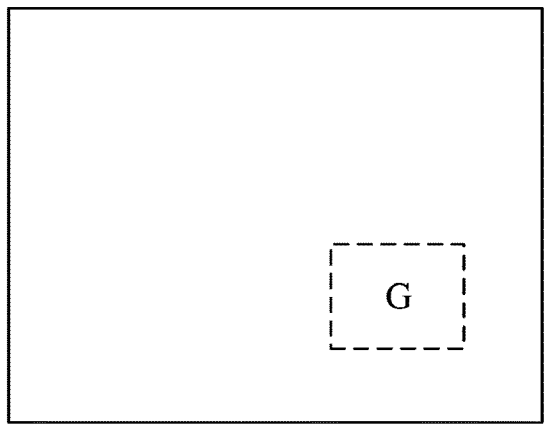
FIG. 6B illustrates a structure of a light-emitting layer of an organic light-emitting device using the method illustrated in FIG. 5 according to a second embodiment of the present disclosure.
Figure 6C:
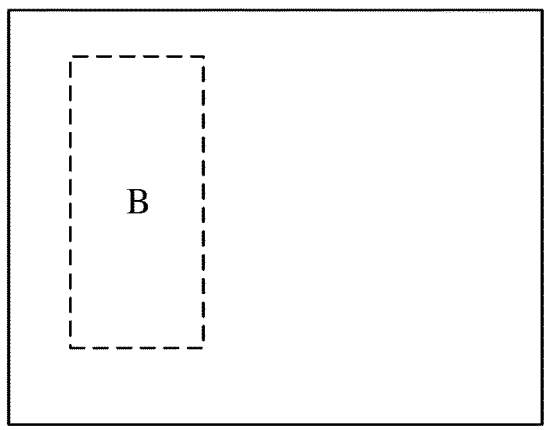
FIG. 6C illustrates a structure of a light-emitting layer of an organic light-emitting device using the method illustrated in FIG. 5 according to a third embodiment of the present disclosure.
Figure 6D:
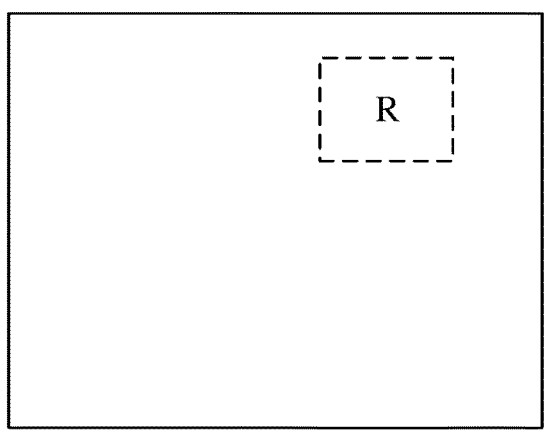
FIG. 6D illustrates a structure of a light-emitting layer of an organic light-emitting device using the method illustrated in FIG. 5 according to a fourth embodiment of the present disclosure.

In one preferred embodiment where the light-emitting layer is produced, at first, a mask with a first aperture is used to form a light-emitting layer which the third light-emitting layer for synthesizing the white subpixel corresponds to. The light-emitting layer is a yellow (Y) light-emitting layer, as FIG. 6A shows. Next, a mask with a smaller aperture is used to produce a green (G) light-emitting layer, as FIG. 6B shows. Next, a mask with a second aperture is used to form a light-emitting layer which synthesizes the color for the white subpixel and the second subpixel corresponds to. The light-emitting layer is a blue (B) light-emitting layer, as FIG. 6C shows. The blue (B) light-emitting layer forms the zone for the white subpixel and the second subpixel. Finally, a mask with a third aperture is used to form a light-emitting layer which the second light-emitting material corresponds to. The light-emitting layer is a red (R) light-emitting layer, as FIG. 6D shows. The first aperture and the second aperture are larger than the third aperture.

The blue light-emitting material in the synthesized color zone and one portion of the yellow third light-emitting material are layered or mixed. The blue light-emitting material and the yellow light-emitting material are compensated in color and emit the white light. Therefore, the blue light-emitting material in the synthesized color zone and the yellow light-emitting material are layered or mixed to form a white subpixel.

Moreover, the original color zone of the blue light-emitting material which is not layered or mixed with the third light-emitting material emits the blue light.

The other portion of the third light-emitting material, i.e., the portion of the yellow light-emitting material not layered or mixed with the blue light-emitting material, is layered with the red light-emitting material. So the mask with the second aperture which is a larger aperture can be used to produce the yellow light-emitting layer. In this way, using of a mask with a small aperture is reduced in this embodiment, which is good for reducing the cost.

Moreover, the red-light material for the red subpixel and the yellow-light material for the red subpixel are partially layered with the zone where the blue subpixel is overlapped or mixed. Because of this reason, the transmission distance of the excitons produced by the second light-emitting material is smaller than the thickness of the function layer with the second light-emitting material in this embodiment. In this way, the red light emitted by the organic light-emitting device is nearly pure, and the light-emitting layer formed by the yellow light-emitting material does not cover the red-light zone partially.

Specifically, the excitons produced by the red light-emitting material exist on the interface between the electron blocking layer (EBL) and the red light-emitting material layer. Since the transmission distance of the excitons produced by the red light-emitting material layer is smaller than the thickness of the red light-emitting material layer, the excitons cannot be transmitted to the yellow light-emitting material layer. Accordingly, the red subpixel does not emit the yellow light. Therefore, the red subpixel definitely emits the pure red light.

The thickness of the red light-emitting material layer (EMLR) is adjusted with practical demands. Normally, the thickness of the red light-emitting material layer (EMLR) ranges from 10 nm to 100 nm.

With the design of the thickness of the function layer with the red light-emitting layer material, the pure red light can be obtained. On the premise that the display effect is not affected, no red filters are necessary. Therefore, the manufacturing process of the organic light-emitting device and the manufacturing method are both simplified. Further, the production costs are saved, and the structure of the organic light-emitting device is more compact.

In any of the above-mentioned embodiments, the white subpixel is adjacent to the blue subpixel, and the white subpixel is adjacent to the red subpixel. No limitations are defined in this embodiment.

In another one of the embodiments, to start with, a light-emitting layer with the red light-emitting material is formed using the mask with the third aperture. Next, a light-emitting layer with the green light-emitting material is formed using the mask. Next, a light-emitting layer with the blue light-emitting material is formed using the mask with the second aperture. Finally, a light-emitting layer with the yellow light-emitting material is formed using the mask with the first aperture. The first aperture and the second aperture are larger than the third aperture. Besides, the light-emitting layer with the green light-emitting material formed using the mask with the aperture is smaller than the first aperture and the second aperture. No limitations are defined in this embodiment.

Compared with the related art where four pixels are formed by a mask including four small apertures, this embodiment skips a mask. Therefore, the production costs of the present disclosure are lower than the production costs of the related art. Compared with the conventional method of synthesizing the primary pixels with the RGB subpixels, in the present disclosure the white light is generated without lighting the RGB subpixels up at the same time, so the organic light-emitting device consumes less power. Compared with the conventional method of combining four white subpixels, a red filter, a blue filter, and a green filter, the present disclosure skips three filters or filter sheets. So the structure of the organic light-emitting device is simpler and thinner. Also, the energy of the light cannot lose easily, and further the organic light-emitting device cannot be damaged easily.

502: Evaporate all of the function layers apart from the light-emitting layer for the subpixel.

In addition, in the above-mentioned embodiment, the primary pixels and the subpixels include function layers, such as a hole injection layer (HTL), a hole transport layer (HTL), an electron stopper layer (ESL), a hole blocking layer (HBL), an electron transport layer (ETL), and an electron injection layer (EIL). All the function layers, but the light-emitting layer, are integrally formed.

Compared with the related art, in the present disclosure each of the plurality of primary pixels includes one or more first subpixel, second subpixel, and third subpixel. The first subpixel is a white subpixel. The second subpixel includes the first light-emitting material for synthesizing the white light. The third subpixel includes the second light-emitting material. The organic light-emitting device further includes a third light-emitting material for synthesizing the white light. The material for the second subpixel includes an original color zone and a synthesized color zone. The first light-emitting material for synthesizing the white light corresponding to the synthesized color zone and one portion of the third light-emitting material are layered or mixed to form the white subpixel. The other portion of the third light-emitting material and the second light-emitting material are layered. The transmission distance of the excitons produced by the second light-emitting material is smaller than the thickness of the function layer with the second light-emitting material. With the method of using the red, green, blue, and white (RGBW) subpixels, the brightness and color saturation of an image is well improved, power consumes less, and the lifespan of the organic light-emitting device is prolonged. Besides, the white subpixel is formed after the one or more light-emitting material for synthesizing the white light and another light-emitting material for a required color are layered or mixed. The white subpixel and one or more of the second subpixels share with a mask with a larger aperture. Compared with the related art where four pixels are formed by a mask including four small apertures, the present disclosure skips a mask. Therefore, the production costs of the present disclosure are lower than the production costs of the related art.

With the design of the thickness of the red light-emitting material layer, the pure red light can be obtained. On the premise that the display effect is not affected, no red filters are necessary. Therefore, the manufacturing process of the organic light-emitting device and the manufacturing method are both simplified. Further, the production costs are saved, and the structure of the organic light-emitting device is more compact.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An organic light-emitting device, comprising:
a substrate layer, a first electrode layer, light-emitting layers, and a second electrode arranged in layers defining a display zone of the organic light-emitting device;
the display zone comprising a plurality of primary pixels; each of the plurality of primary pixels comprising a first subpixel, a second subpixel, and a third subpixel; the first subpixel being a white subpixel; the second subpixel comprising a first light-emitting material for synthesizing white light; the third subpixel comprising a second light-emitting material; and
the organic light-emitting device further comprising a third light-emitting material for synthesizing the white light; the first light-emitting material comprising an original color zone and a synthesized color zone; the first light-emitting material for synthesizing the white light corresponding to the synthesized color zone and one portion of the third light-emitting material being layered or mixed to form the white subpixel;
the other portion of the third light-emitting material and the second light-emitting material being layered; a transmission distance of an exciton produced by the second light-emitting material being smaller than a thickness of the second light-emitting material; the third light-emitting material being formed in a zone corresponding to the white subpixel and the third subpixel;
wherein all function layers apart from the light-emitting layers of all of the subpixels are integrally formed.

2. The organic light-emitting device of claim 1, wherein the second subpixel is a blue subpixel, the third subpixel is a red subpixel, and the first light-emitting material is a blue light-emitting layer comprising the original color zone and the synthesized color zone;
the second light-emitting material is a red light-emitting material, and the third light-emitting material is a yellow light-emitting material.

3. The organic light-emitting device of claim 2, wherein an entity of the light-emitting material can be is made from a hole-type material or electron-type material.

4. The organic light-emitting device of claim 2, wherein the thickness of the red light-emitting material ranges from 10 nm to 100 nm.

5. The organic light-emitting device of claim 2, wherein the organic light-emitting device further comprises a green subpixel.

6. An organic light-emitting device, comprising:
a substrate layer, a first electrode layer, light-emitting layers, and a second electrode arranged in layers defining a display zone of the organic light-emitting device;
the display zone comprising a plurality of primary pixels; each of the plurality of primary pixels comprising a first subpixel, a second subpixel, and a third subpixel; the first subpixel being a white subpixel; the second subpixel comprising a first light-emitting material for synthesizing white light; the third subpixel comprising a second light-emitting material;
the organic light-emitting device further comprising a third light-emitting material for synthesizing the white light; the first light-emitting material comprising an original color zone and a synthesized color zone; the first light-emitting material for synthesizing the white light corresponding to the synthesized color zone and one portion of the third light-emitting material being layered or mixed to form the white subpixel;
the other portion of the third light-emitting material and the second light-emitting material being layered; a transmission distance of an exciton produced by the second light-emitting material being smaller than a thickness of the second light-emitting material.

7. The organic light-emitting device of claim 6, wherein all function layers apart from the light-emitting layers of all of the subpixels are integrally formed.

8. The organic light-emitting device of claim 6, wherein the third light-emitting material is formed in a zone corresponding to the white subpixel and the third subpixel.

9. The organic light-emitting device of claim 6, wherein the second subpixel is a blue subpixel, the third subpixel is a red subpixel, and the first light-emitting material is a blue light-emitting layer comprising the original color zone and the synthesized color zone;
the second light-emitting material is a red light-emitting material, and the third light-emitting material is a yellow light-emitting material.

10. The organic light-emitting device of claim 9, wherein an entity of the light-emitting material is made from a hole-type material or an electron-type material.

11. The organic light-emitting device of claim 6, wherein the thickness of the red light-emitting material ranges from 10 nm to 100 nm.

12. The organic light-emitting device of claim 9, wherein the organic light-emitting device further comprises a green subpixel.

13. The organic light-emitting device of claim 2, wherein the second light-emitting material is a red light-emitting layer, the third light-emitting material is a yellow light-emitting layer, the yellow light-emitting layer is larger than the red light-emitting layer in size.

14. The organic light-emitting device of claim 1, wherein the organic light-emitting device does not comprise a red filter.

15. The organic light-emitting device of claim 2, wherein the second light-emitting material is a red light-emitting material layer, the third light-emitting material is a yellow light-emitting material layer, the red subpixel orderly comprises a hole injection layer, a hole transport layer, an electron blocking layer, the red light-emitting material layer, the yellow light-emitting material layer, a hole blocking layer, an electron transport layer, and an electron injection layer from one side to another side.

16. An organic light-emitting device, comprising:
a substrate layer, a first electrode layer, a plurality of light-emitting layers and a second electrode layer, wherein the plurality of light-emitting layers are disposed between the first electrode layer and the second electrode layer;
wherein
the organic light-emitting device defines a plurality of primary pixels, and each of the plurality of primary pixels comprises a white subpixel, a blue subpixel, a red subpixel and a green subpixel;

the plurality of light-emitting layers comprises a blue light-emitting material layer, a yellow light-emitting material layer, a red light-emitting material layer and a green light-emitting material layer;

a first portion of the blue light-emitting material layer is located within the blue subpixel, a second portion of the blue light-emitting material layer is located within the white subpixel;

a first portion of the yellow light-emitting material layer is located within the white subpixel and layered or mixed with the second portion of the blue light-emitting material layer, a second portion of the yellow light-emitting material layer is located within the red subpixel;

the red light-emitting material layer is located within the red subpixel and layered with the second portion of the yellow light-emitting material layer;

the green light-emitting material layer is located within the green subpixel; and a transmission distance of an exciton produced in the red light-emitting material layer is smaller than a thickness of the red light-emitting material layer.

17. The organic light-emitting device of claim 16, wherein there arranges no red filter within the red subpixel.

18. The organic light-emitting device of claim 16, further comprising a hole injection layer, a hole transport layer, an electron blocking layer, a hole blocking layer, an electron transport layer and an electron injection layer;

wherein the hole injection layer, the hole transport layer, the electron blocking layer, the red light-emitting material layer, the second portion of the yellow light-emitting material layer, the hole blocking layer, the electron transport layer and the electron injection layer are stacked together in order.

* * * * *